United States Patent
Shen et al.

(10) Patent No.: US 10,424,524 B2
(45) Date of Patent: Sep. 24, 2019

(54) MULTIPLE WAFERS FABRICATION TECHNIQUE ON LARGE CARRIER WITH WARPAGE CONTROL STIFFENER

(71) Applicant: DiDrew Technology (BVI) Limited, Santa Clara, CA (US)

(72) Inventors: Minghao Shen, Santa Clara, CA (US); Xiaotian Zhou, Santa Clara, CA (US)

(73) Assignees: CHENGDU ESWIN SIP TECHNOLOGY CO., LTD., Chengdu (CN); BEIJING ESWIN TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/934,080

(22) Filed: Mar. 23, 2018

(65) Prior Publication Data

US 2019/0252278 A1 Aug. 15, 2019

Related U.S. Application Data (60) Provisional application No. 62/632,138, filed on Feb. 19, 2018, provisional application No. 62/631,305, filed on Feb. 15, 2018.

(51) Int. Cl.
| | |
|---|---|
| *H01L 23/28* | (2006.01) |
| *H01L 23/00* | (2006.01) |
| *H01L 23/538* | (2006.01) |
| *H01L 25/00* | (2006.01) |
| *H01L 25/065* | (2006.01) |

(52) U.S. Cl.
CPC .......... *H01L 23/28* (2013.01); *H01L 23/5385* (2013.01); *H01L 23/562* (2013.01); *H01L 25/0657* (2013.01); *H01L 25/50* (2013.01)

(58) Field of Classification Search
None
See application file for complete search history.

(56) References Cited

U.S. PATENT DOCUMENTS

| | | |
|---|---|---|
| 5,379,942 A | 1/1995 | Kuhnert |
| 5,436,745 A | 7/1995 | Voisin |
| 5,705,855 A | 1/1998 | Carson |
| 5,822,030 A | 10/1998 | Uchiyama |
| 6,373,545 B1 | 4/2002 | Yang |

(Continued)

OTHER PUBLICATIONS

Chip-On-Glass (COG) for LCD Modules, NXP.

(Continued)

*Primary Examiner* — Duy T Nguyen
*Assistant Examiner* — Bo B Jang
(74) *Attorney, Agent, or Firm* — Burke, Williams & Sorensen, LLP (57) ABSTRACT

Disclosed is a method of manufacturing a semiconductor device that includes adhering a plurality of semiconductor substrates and a framing member to a supporting surface of a carrier substrate. The semiconductor substrates can be wafers that can be diced or cut into a plurality of dies. Thus, the wafers each have respective active surfaces and at least one respective integrated circuit region. The method can further include encapsulating the framing member and the plurality of semiconductor substrates within an encapsulant. Subsequently, the carrier substrate is removed and a redistribution layer (RDL) is formed on the semiconductor substrates and the framing member.

20 Claims, 4 Drawing Sheets

(56) References Cited

U.S. PATENT DOCUMENTS

| | | |
|---|---|---|
| 6,456,353 B1 | 9/2002 | Chen |
| 6,534,338 B1 | 3/2003 | Schoonejongen |
| 6,627,996 B1 | 9/2003 | Yokoyama |
| 6,885,032 B2 | 4/2005 | Forbes |
| 7,002,809 B2 | 2/2006 | Lee |
| 7,839,469 B2 | 11/2010 | Wu |
| 8,044,464 B2 | 10/2011 | Yamazaki |
| 8,048,358 B2 | 11/2011 | Takano |
| 8,513,124 B1 | 8/2013 | Ponnuswamy |
| 9,202,716 B2 | 12/2015 | Park et al. |
| 9,381,732 B2 | 7/2016 | Lindner et al. |
| 9,449,935 B1 | 9/2016 | Shih et al. |
| 9,502,323 B2 | 11/2016 | Lin et al. |
| 9,547,208 B2 | 1/2017 | Grip |
| 9,664,932 B2 | 5/2017 | Nishino |
| 9,679,785 B2 | 6/2017 | Chinnusamy |
| 9,766,518 B2 | 9/2017 | Fujikawa |
| 9,911,672 B1 | 3/2018 | Wu et al. |
| 2002/0142566 A1 | 10/2002 | Ravi |
| 2003/0137621 A1 | 7/2003 | Zhang |
| 2005/0029644 A1 | 2/2005 | Ho |
| 2006/0290011 A1 | 12/2006 | Cobbley |
| 2007/0117354 A1 | 5/2007 | Gadkaree |
| 2008/0111786 A1 | 5/2008 | Goudarzi |
| 2008/0142946 A1 | 6/2008 | Yang |
| 2008/0182363 A1 | 7/2008 | Amrine |
| 2008/0268618 A1 | 10/2008 | Yamazaki |
| 2009/0001504 A1 | 1/2009 | Takei |
| 2010/0072618 A1 | 3/2010 | Camacho |
| 2010/0203676 A1 | 8/2010 | Theuss |
| 2011/0127654 A1 | 6/2011 | Weng |
| 2011/0221041 A1 | 9/2011 | Lin |
| 2011/0316156 A1 | 12/2011 | Pagaila |
| 2012/0000613 A1 | 1/2012 | Thallner |
| 2012/0217643 A1 | 8/2012 | Pagaila |
| 2013/0134445 A1 | 5/2013 | Tarsa |
| 2013/0277675 A1* | 10/2013 | Yoshikawa ....... H01L 21/76259 |
| | | 257/49 |
| 2014/0061893 A1 | 3/2014 | Saeidi |
| 2014/0175637 A1 | 6/2014 | Stuber et al. |
| 2014/0335658 A1 | 11/2014 | Scanlan |
| 2015/0055036 A1 | 2/2015 | Weber et al. |
| 2015/0325520 A1 | 11/2015 | Yu |
| 2016/0054612 A1 | 2/2016 | Hao |
| 2016/0099242 A1 | 4/2016 | Mallikarjunaswamy |
| 2016/0111035 A1 | 4/2016 | Morita |
| 2016/0203787 A1 | 7/2016 | Park |
| 2016/0238862 A1 | 8/2016 | Nishino |
| 2016/0276307 A1 | 9/2016 | Lin |
| 2016/0372426 A1 | 12/2016 | Luan |
| 2017/0018450 A1 | 1/2017 | Tang |
| 2017/0103904 A1 | 4/2017 | Nguyen |
| 2017/0200647 A1 | 7/2017 | Stering |
| 2018/0040489 A1 | 2/2018 | Fehkuhrer |
| 2018/0076142 A1 | 3/2018 | Shim et al. |
| 2018/0145059 A1 | 5/2018 | Welch |

OTHER PUBLICATIONS

Matope, S. et al. "Silver, Copper and Aluminium Coatings for Micro-Material Handling Operations", South African Journal of Industrial Engineering, Aug. 2013, vol. 24(2), pp. 69-77.

Solder from Wikipedia.

* cited by examiner

MULTIPLE WAFERS FABRICATION TECHNIQUE ON LARGE CARRIER WITH WARPAGE CONTROL STIFFENER

RELATED APPLICATION

The present application claims priority to U.S. Provisional Application No. 62/631,305 filed Feb. 15, 2018, entitled "Large Panel Wafer Level Packaging Process" and U.S. Provisional Application No. 62/632,138 filed Feb. 19, 2018, entitled "Large Panel Wafer Level Packaging with Stiffener" both of which are incorporated herein by reference in their entirety.

FIELD OF THE INVENTION

The present disclosure relates to semiconductor packaging technologies.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation.

The terms "die", "semiconductor chip", and "semiconductor die" are used interchangeably throughout this specification. The term wafer is used herein include any structure having an exposed surface onto which a layer is deposited according to the present invention, for example, to form the circuit structure.

FIGS. 1A through 1E show schematic, cross-sectional diagrams of a typical method for fabricating a wafer level package having a redistribution layer (RDL).

Figure 1A:
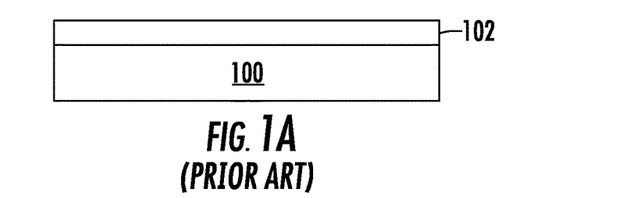
FIGS. 1A-1E show schematic, cross-sectional diagram of a traditional method for fabricating a wafer level package.
Figure 1B:
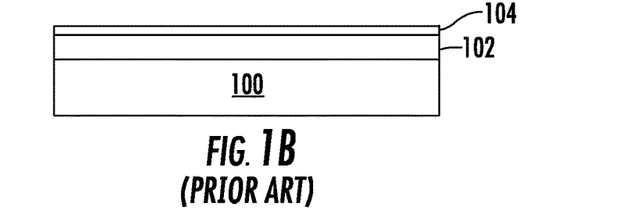
Figure 1C:
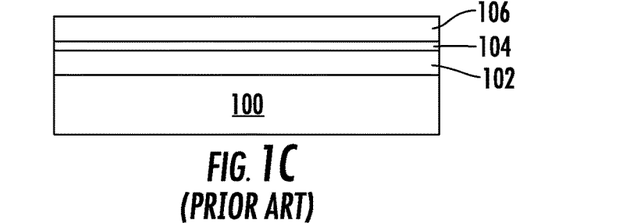
Figure 1D:
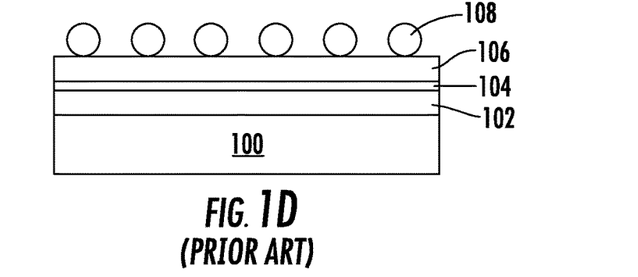
Figure 1E:
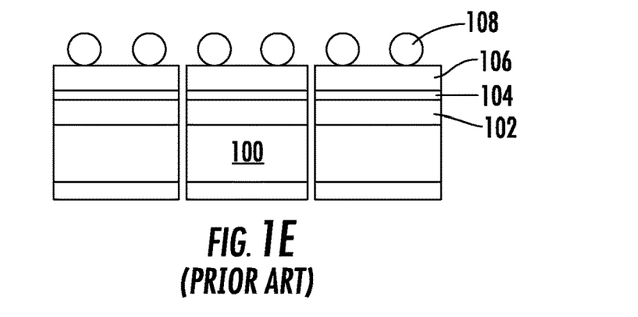

As shown in FIG. 1A, a wafer 100 is prepared. The wafer 100 may include a plurality of semiconductor device structures (not shown) formed according to known processes. An RDL layer is then formed according to known processes on the wafer 100. In FIGS. 1A-1E, the RDL is symbolically illustrated as the group of layers 102, 104, and 106. The RDL is typically defined by the addition of metal and dielectric layers onto the surface of the wafer to re-route the I/O layout into a looser pitch footprint. Such redistribution typically includes thin film polymers such as BCB, PI or other organic polymers and metallization such as Al or Cu to reroute the peripheral pads to an area array configuration. Layers 102 and 106 represent dielectric layers and layer 104 represents metallic features. Layers 102, 104, and 106 collectively represent dielectric and metal layers formed to allow for electrical communication from the wafer 100 to solder bumps or solder balls 108 shown in FIG. 1E. Solder balls 108 are formed on the RDL for further connection. As also shown in FIG. 1E, a dicing or sawing process may be performed along kerf regions of the wafer to separate individual wafer level dies from one another.

In wafer level packaging, the wafer and the dies are susceptible to warping due to coefficient of thermal expansion (CTE) mismatch. It is known that wafer warpage continues to be a concern. Warpage can prevent successful assembly of a die-to-wafer stack because of the inability to maintain the coupling of the die and wafer. Warpage issue is serious especially in a large sized wafer and has raised an obstacle to a wafer level semiconductor packaging process that requires fine-pitch RDL process.

The present disclosure provides novel improved packaging methods resulting in reduced warpage or other defects.

BRIEF SUMMARY

Methods of manufacturing a semiconductor device according to the present disclosure can include providing a plurality of semiconductor substrates, such as wafers, that each have a respective active surface and at least one respective integrated circuit region.

The method can also include adhering the plurality of semiconductor substrates to a supporting surface of a carrier substrate and adhering a framing member to the supporting surface of the carrier substrate. The method can further include encapsulating the framing member and the plurality of semiconductor substrates within an encapsulant, thereby resulting in a multi-wafer encapsulated layer. Subsequently, the method can include removing the carrier substrate from the multi-wafer encapsulated layer and forming a redistribution layer (RDL) on the semiconductor substrates of the multi-wafer encapsulated layer, thereby resulting in a multi-wafer panel.

In some embodiments, the carrier substrate and/or the framing member can have a coefficient of thermal expansion (CTE) that substantially matches a CTE of the plurality of semiconductor substrates.

In some embodiments, at least a portion of the framing member can extend along the supporting surface of the carrier substrate between at least two of the plurality of semiconductor substrates.

In some embodiments, in some embodiments, the method can further include dicing the multi-layer panel to obtain separate semiconductor devices.

In some embodiments, each of the plurality of semiconductor substrates can be wafers made of silicon or can be any other kind of semiconductor wafer.

In one embodiment, a method of manufacturing a semiconductor device includes: plurality of semiconductor substrates, each having a respective active surface and at least one respective integrated circuit region; adhering the plurality of semiconductor substrates to a supporting surface of a carrier substrate; adhering a framing member to the supporting surface of the carrier substrate; encapsulating the framing member and the plurality of semiconductor substrates within an encapsulant, thereby resulting in a multi-wafer encapsulated layer; removing the carrier substrate from the multi-wafer encapsulated layer; and forming a redistribution layer (RDL) on the semiconductor substrates of the multi-wafer encapsulated layer, thereby resulting in a multi-wafer panel.

In one embodiment, the multi-wafer panel may be further subjected to a dicing step whereby the multi-layer panel can be singulated to obtain separate semiconductor devices. In some embodiments, the carrier substrate may have a coefficient of thermal expansion (CTE) that substantially matches a CTE of the plurality of semiconductor substrates. In other embodiments, the framing member may also have a coefficient of thermal expansion (CTE) that substantially matches a CTE of the plurality of semiconductor substrates and/or the carrier substrate.

In one embodiment, at least a portion of the framing member can extend along the supporting surface of the carrier substrate between at least two of the plurality of semiconductor substrates. In some embodiments, each of the plurality of semiconductor substrates may include silicon, and that the framing member may have a coefficient of thermal expansion (CTE) that substantially matches the CTE of silicon.

In another embodiment, the method of manufacturing a semiconductor device includes providing first and second semiconductor substrates, each having a respective active surface and at least one respective integrated circuit region; adhering the first and second semiconductor substrates to a supporting surface of a carrier substrate; adhering a framing member to the supporting surface of the carrier substrate, wherein at least a portion of the framing member extends between the first and second semiconductor substrates; encapsulating the framing member and the first and second semiconductor substrates within an encapsulant, thereby resulting in a multi-wafer encapsulated layer, wherein at least a portion of the encapsulant forms an encapsulant channel between the framing member and at least one of the first and second semiconductor substrates; removing the carrier substrate from the multi-wafer encapsulated layer; and forming a redistribution layer (RDL) on the first and second semiconductor substrates of the multi-wafer encapsulated layer, thereby resulting in a multi-wafer panel.

In some embodiments, in the methods discussed above, the carrier substrate may have a coefficient of thermal expansion (CTE) that substantially matches a CTE of the first and second semiconductor substrates. In other embodiments, the framing member has a coefficient of thermal expansion (CTE) that substantially matches a CTE of the first and second semiconductor substrates and/or that of the carrier substrate.

In one embodiment, at least a portion of the framing member extends along the supporting surface of the carrier between the first and second semiconductor substrates. In some embodiments, each of the first and second semiconductor substrates includes silicon and the framing member has a coefficient of thermal expansion (CTE) that substantially matches the CTE of silicon.

In one embodiment, a method of manufacturing a semiconductor device includes: providing a framing member that defines first and second through-holes thereof; adhering a framing member to a supporting surface of a carrier substrate; adhering first and second semiconductor substrates to a supporting surface of a carrier substrate respectively through the first and second framing member through-holes; encapsulating the framing member and the first and second semiconductor substrates within an encapsulant, thereby resulting in a multi-wafer encapsulated layer, wherein at least a portion of the encapsulant forms an encapsulant channel between the framing member and at least one of the first and second semiconductor substrates; removing the carrier substrate from the multi-wafer encapsulated layer; and forming a redistribution layer (RDL) on the first and second semiconductor substrates of the multi-wafer encapsulated layer, thereby resulting in a multi-wafer panel.

In one embodiment, a method of fabricating a semiconductor device starts with a step of providing a plurality of semiconductor substrates, each having a respective active surface and at least one respective integrated circuit region, followed by the next step of adhering the plurality of semiconductor substrates to a supporting surface of a carrier substrate. Next step includes encapsulating the plurality of semiconductor substrates within an encapsulant, thereby resulting in a multi-wafer encapsulated layer. In this embodiment, there are no framing members. The process continues with the step of removing the carrier substrate from the multi-wafer encapsulated layer, followed by the next step of forming a redistribution layer (RDL) on the semiconductor substrates of the multi-wafer encapsulated layer, thereby resulting in a multi-wafer panel. In one embodiment, the multi-wafer panel may be further subjected to a dicing step whereby the multi-layer panel can be singulated to obtain separate semiconductor devices.

DETAILED DESCRIPTION

This disclosure relates to a wafer level packaging process. For example, in semiconductor wafer packaging processes, the wafer can be a semiconductor wafer or device wafer which has thousands of chips on it. Thin wafers, especially ultra-thin wafers (thickness less than 60 microns or even 30 microns) are very unstable, and more susceptible to stress than traditional thick wafers. During processing, thin wafers may be easily broken and warped. Therefore, temporary bonding to a rigid support carrier substrate can reduce the risk of damage to the wafer. A carrier substrate, may be square or rectangular shaped panels made of glass, sapphire, metal, or other rigid materials to increase chips volumes. In one wafer packaging method, wafers are placed temporarily on temporary adhesive coated carrier substrate, are encapsulated within an encapsulant material, such as an epoxy molding compound. The encapsulated wafers are then processed with desired semiconductor packaging operations including RDL formation and dicing into individual chips.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

FIGS. 2A-2E show schematic, cross-sectional diagrams showing an exemplary method for fabricating a wafer level package according to the present disclosure.

Figure 2A:
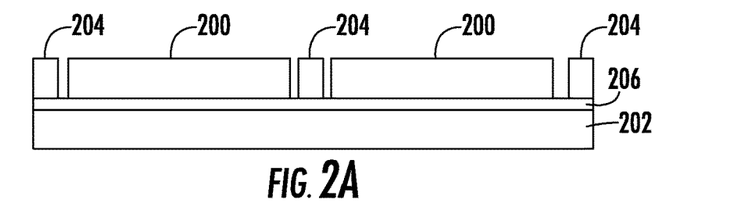
FIGS. 2A-2E show schematic, cross-sectional diagrams of an exemplary method for fabricating a wafer level package according to embodiments of the present disclosure.

As shown in FIG. 2A, a carrier substrate 202 is prepared. The carrier substrate 202 may include a releasable substrate material. An adhesive layer 206 is disposed on a top surface of the carrier substrate 202. In one embodiment, the carrier substrate 202 may be a glass substrate, but may alternatively be any other material having a CTE that is matched to that of the wafers 200 being processed. For example, the carrier substrate 202 may also be ceramic, sapphire or quartz. The adhesive layer 206 may be adhesive tape, or alternatively, may be a glue or epoxy applied to the carrier substrate 202 via a spin-on process, or the like.

Subsequently, wafers 200 and a framing member 204 may be mounted on a supporting surface of the carrier substrate 202 via the adhesive layer 206. A plan view of an exemplary framing member 204 is also shown in FIG. 3. In some embodiments, there need not be any framing members 204. In other words, the wafers 200 would be mounted on the supporting surface of the carrier substrate 202 via the adhesive layer 206 without any adjacent framing member 204. The carrier substrate can be formed of glass or other suitable material having a CTE at least substantially matching that of the wafers 200. For example, the carrier substrate 202 may also be ceramic, sapphire or quartz. The wafers 200 can include semiconductor circuitry formed thereon that is suitable for being cut or diced into a plurality of dies. The framing member 204 may include a plurality of through-holes that are sized and shaped to allow for respective wafers 200 to be positioned therein as shown in FIGS. 2A-2E and 3. The framing member 204 may also be referred to as a stiffener material. In some embodiments, the framing member 204 may be formed of glass, ceramic, sapphire, quartz, or other suitable material having a CTE at least substantially matching that of the wafers 200 and/or the carrier substrate 202.

The order of assembly can vary; in other words, the framing member 204 may be placed before, during, or after placement of the wafers 200. Also, while four wafers 200 and through-holes are shown, alternative embodiments can include any number of wafers 200 and through-holes. Also, while the framing member 204 is illustrated as being square and the wafers 200 illustrated as being circular, alternative embodiments of the framing member 204 can have any desired shape. For example, the framing member 204 may be circular or rectangular, and likewise the wafers 200 can be square or rectangular as well. The wafers 200 and framing member 204 may be mounted on the carrier substrate 202 by using any conventional surface mount technique, including adhesives, glue and/or temporary tapes, but not limited thereto.

Figure 2B:
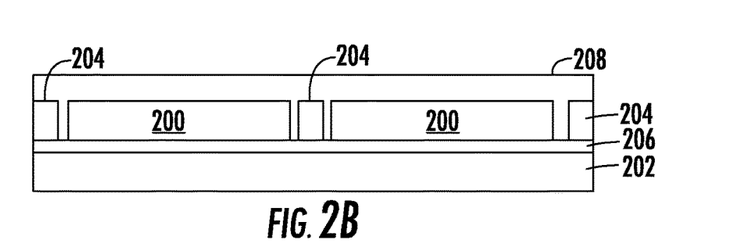
Figure 3:
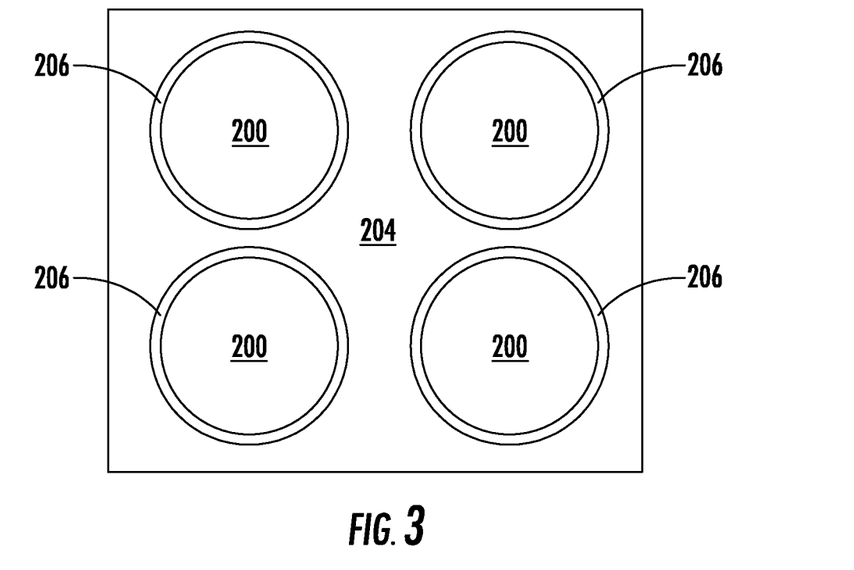
FIG. 3 shows a plan view of an embodiment of a framing member according to an embodiment of the present disclosure.

As shown in FIG. 2B, after the wafers 200 and framing member 204 are mounted on the carrier substrate 202, an encapsulant, such as molding compound 208, is applied. The molding compound 208 covers the attached wafers 200 and framing member 204. In embodiments without framing member 204, the molding compound 208 would simply cover the attached wafers 200. The molding compound 208 can also fill any gaps that may exist between the wafers 200 and the framing member 204. The molding compound 208 may then be subjected to a curing process. In some embodiments where the framing member 204 is not present, the molding compound 208 would simply fill the gaps between wafers 200.

According to the illustrated embodiment, the molding compound 208 may be formed using thermoset molding compounds in a transfer mold press, for example. Other means of dispensing the molding compound may be used. Epoxies, resins, and compounds that are liquid at elevated temperature or liquid at ambient temperatures may be used. The molding compound 208 can be an electrical insulator and can be a thermal conductor. Different fillers may be added to enhance the thermal conduction, stiffness or adhesion properties of the molding compound 208.

Figure 2C:
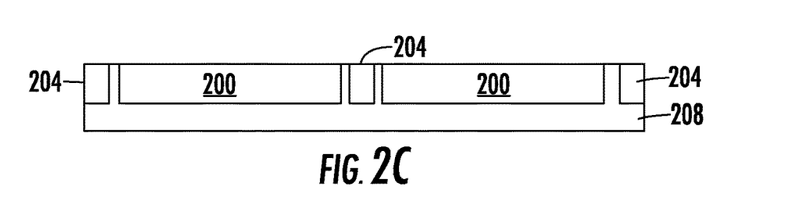
Figure 2D:
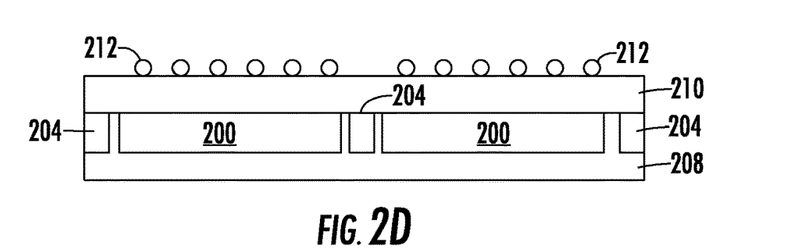
Figure 2E:
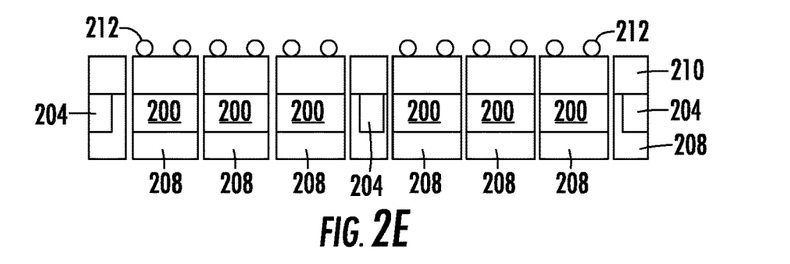

Turning next to FIGS. 2C-2E, note that the illustrated structure is flipped over such that the top side as shown in FIGS. 2A-2B is the bottom side as shown in FIGS. 2C-2E. As shown in FIG. 2C, after the formation of the molding compound 208, the carrier substrate 202 and the adhesive layer 206 are removed or peeled off to expose the wafers 200 and framing member 204.

As shown in FIG. 2D, subsequently, an RDL 210 may be fabricated using known RDL formation techniques. Also, to provide electrical connection between the RDL 210 and other circuitry, a plurality of bumps 212 such as microbumps or copper pillars are formed. Optionally, a thermal process may be performed to reflow the bumps 212.

As shown in FIG. 2E, a dicing or sawing process may be performed along kerf regions to separate individual wafers 200 and their respective wafer level packages from one another. It is understood that the sectional structures depicted in the figures are for illustration purposes only.

Figure 4:
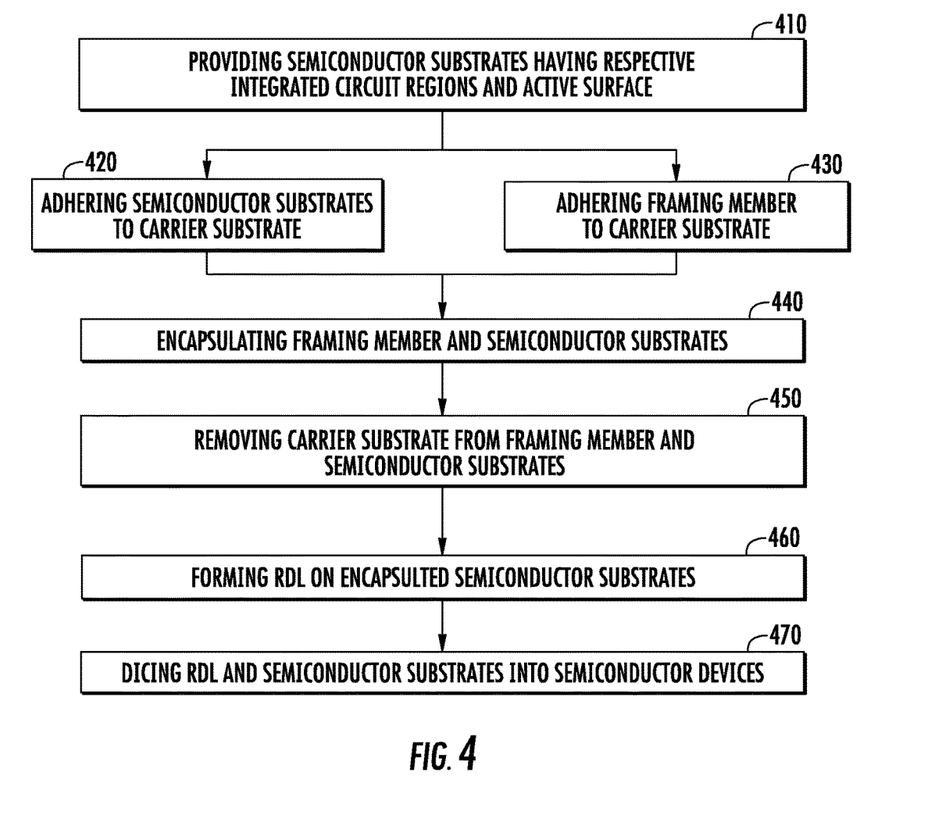
FIG. 4 is a process flow diagram showing an exemplary method for fabricating a wafer level package according to the present disclosure.

FIG. 4 is a process flow diagram 400 showing an exemplary method for fabricating a wafer level package according to the present disclosure. In this embodiment, the method of manufacturing a semiconductor device starts with a step 410 of providing a plurality of semiconductor substrates, each having a respective active surface and at least one respective integrated circuit region. In one embodiment, the next step 420 involves adhering the plurality of semiconductor substrates to a supporting surface of a carrier substrate, followed by the step 430 of adhering a framing member to the supporting surface of the carrier substrate. In an alternative embodiment, steps 420 and 430 may be carried out in reverse order, e.g., step 430 followed by step 420. Next step 440 involves encapsulating the framing member and the plurality of semiconductor substrates within an encapsulant, thereby resulting in a multi-wafer encapsulated layer, followed by the processing step 450 of removing the carrier substrate from the multi-wafer encapsulated layer. The next step 460 of the process includes forming a redistribution layer (RDL) on the semiconductor substrates of the multi-wafer encapsulated layer, thereby resulting in a multi-wafer panel. In one embodiment, the multi-wafer panel may be further subjected to a dicing step 470 whereby the multi-layer panel can be singulated to obtain separate semiconductor devices.

In some embodiments, in the methods discussed above, the carrier substrate may have a coefficient of thermal expansion (CTE) that substantially matches a CTE of the plurality of semiconductor substrates. Likewise, the framing member may also have a coefficient of thermal expansion (CTE) that substantially matches a CTE of the plurality of semiconductor substrates and/or the carrier substrate.

In one embodiment, at least a portion of the framing member can extend along the supporting surface of the carrier substrate between at least two of the plurality of semiconductor substrates. In these embodiments, each of the plurality of semiconductor substrates may include silicon, and that the framing member may have a coefficient of thermal expansion (CTE) that substantially matches the CTE of silicon.

In another embodiment, the method of manufacturing a semiconductor device includes providing first and second semiconductor substrates, each having a respective active surface and at least one respective integrated circuit region; adhering the first and second semiconductor substrates to a supporting surface of a carrier substrate; adhering a framing member to the supporting surface of the carrier substrate, wherein at least a portion of the framing member extends between the first and second semiconductor substrates; encapsulating the framing member and the first and second semiconductor substrates within an encapsulant, thereby resulting in a multi-wafer encapsulated layer, wherein at least a portion of the encapsulant forms an encapsulant channel between the framing member and at least one of the first and second semiconductor substrates; removing the carrier substrate from the multi-wafer encapsulated layer; and forming a redistribution layer (RDL) on the first and second semiconductor substrates of the multi-wafer encapsulated layer, thereby resulting in a multi-wafer panel.

In some embodiments, in the methods discussed above, the carrier substrate may have a coefficient of thermal expansion (CTE) that substantially matches a CTE of the first and second semiconductor substrates. Likewise, the framing member has a coefficient of thermal expansion (CTE) that substantially matches a CTE of the first and second semiconductor substrates and/or that of the carrier substrate.

In one embodiment, at least a portion of the framing member extends along the supporting surface of the carrier between the first and second semiconductor substrates. In another embodiment, the method as discussed above may further include dicing the multi-wafer panel to obtain separate semiconductor devices. In some embodiments, each of the first and second semiconductor substrates includes silicon and the framing member has a coefficient of thermal expansion (CTE) that substantially matches the CTE of silicon.

In one embodiment, a method of manufacturing a semiconductor device includes: providing a framing member that defines first and second through-holes thereof; adhering a framing member to a supporting surface of a carrier substrate; adhering first and second semiconductor substrates to a supporting surface of a carrier substrate respectively through the first and second framing member through-holes; encapsulating the framing member and the first and second semiconductor substrates within an encapsulant, thereby resulting in a multi-wafer encapsulated layer, wherein at least a portion of the encapsulant forms an encapsulant channel between the framing member and at least one of the first and second semiconductor substrates; removing the carrier substrate from the multi-wafer encapsulated layer; and forming a redistribution layer (RDL) on the first and second semiconductor substrates of the multi-wafer encapsulated layer, thereby resulting in a multi-wafer panel.

In some embodiments, in the method discussed above the carrier substrate may have a coefficient of thermal expansion (CTE) that substantially matches a CTE of the first and second semiconductor substrates. In other embodiments, the framing member may have a coefficient of thermal expansion (CTE) that substantially matches a CTE of the first and second semiconductor substrates, and/or that of the carrier substrate.

In one embodiment, each of the first and second semiconductor substrates includes silicon. In another embodiment, the framing member has a coefficient of thermal expansion (CTE) that substantially matches the CTE of silicon.

In one embodiment, the methods discussed above further includes dicing the multi-wafer panel to obtain separate semiconductor devices.

In one embodiment, a method of fabricating a semiconductor device need not include step 430. In other words, the method starts with a step 410 of providing a plurality of semiconductor substrates, each having a respective active surface and at least one respective integrated circuit region, followed by the next step 420 of adhering the plurality of semiconductor substrates to a supporting surface of a carrier substrate. Next step 440 includes encapsulating the plurality of semiconductor substrates within an encapsulant, thereby resulting in a multi-wafer encapsulated layer. In this embodiment, there are no framing members 204. The process continues with the step 450 of removing the carrier substrate from the multi-wafer encapsulated layer, followed by the next step 460 of forming a redistribution layer (RDL) on the semiconductor substrates of the multi-wafer encapsulated layer, thereby resulting in a multi-wafer panel. In one embodiment, the multi-wafer panel may be further subjected to a dicing step 470 whereby the multi-layer panel can be singulated to obtain separate semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing a plurality of semiconductor substrates, each having a respective active surface and at least one respective integrated circuit region, and each being configured for being cut into respective groups of dies such that the plurality of semiconductor substrates can be cut into a plurality of groups of dies;

adhering the plurality of semiconductor substrates to a supporting surface of a carrier substrate;

adhering a framing member to the supporting surface of the carrier substrate;

encapsulating the framing member and the plurality of semiconductor substrates within an encapsulant, thereby resulting in a multi-wafer encapsulated layer;

removing the carrier substrate from the multi-wafer encapsulated layer; and forming a redistribution layer (RDL) on the semiconductor substrates of the multi-wafer encapsulated layer, thereby resulting in a multi-wafer panel.

2. The method of claim 1, wherein the carrier substrate has a coefficient of thermal expansion (CTE) that substantially matches a CTE of the plurality of semiconductor substrates.

3. The method of claim 1, wherein the framing member has a coefficient of thermal expansion (CTE) that substantially matches a CTE of the plurality of semiconductor substrates.

4. The method of claim 1, wherein at least a portion of the framing member extends along the supporting surface of the carrier substrate between at least two of the plurality of semiconductor substrates.

5. The method of claim 1, further comprising dicing the multi-wafer panel into separate dies that include the plurality of groups of dies.

6. The method of claim 1, wherein each of the plurality of semiconductor substrates comprises silicon.

7. The method of claim 6, wherein the framing member has a coefficient of thermal expansion (CTE) that substantially matches a CTE of silicon.

8. A method of manufacturing a semiconductor device, comprising:

providing first and second semiconductor substrates, each having a respective active surface and at least one respective integrated circuit region, the first semiconductor substrate being configured for being cut into a first group of dies and the second semiconductor substrate being configured for being cut into a second group of dies;

adhering the first and second semiconductor substrates to a supporting surface of a carrier substrate;

adhering a framing member to the supporting surface of the carrier substrate, wherein at least a portion of the framing member extends between the first and second semiconductor substrates;

encapsulating the framing member and the first and second semiconductor substrates within an encapsulant, thereby resulting in a multi-wafer encapsulated layer, wherein at least a portion of the encapsulant forms an encapsulant channel between the framing member and at least one of the first and second semiconductor substrates;

removing the carrier substrate from the multi-wafer encapsulated layer;

forming a redistribution layer (RDL) on the first and second semiconductor substrates of the multi-wafer encapsulated layer, thereby resulting in a multi-wafer panel.

9. The method of claim 8, wherein the carrier substrate has a coefficient of thermal expansion (CTE) that substantially matches a CTE of the first and second semiconductor substrates.

10. The method of claim 8, wherein the framing member has a coefficient of thermal expansion (CTE) that substantially matches a CTE of the first and second semiconductor substrates.

11. The method of claim 8, wherein at least a portion of the framing member extends along the supporting surface of the carrier between the first and second semiconductor substrates.

12. The method of claim 8, further comprising dicing the multi-wafer panel into separate dies that include the first and second groups of dies.

13. The method of claim 8, wherein each of the first and second semiconductor substrates comprises silicon.

14. The method of claim 13, wherein the framing member has a coefficient of thermal expansion (CTE) that substantially matches a CTE of silicon.

15. A method of manufacturing a semiconductor device, comprising:

providing a framing member that defines first and second through-holes thereof;

adhering the framing member to a supporting surface of a carrier substrate;

adhering first and second semiconductor substrates to the supporting surface of the carrier substrate respectively through the first and second through-holes of the framing member, wherein the first semiconductor substrate is configured for being cut into a first group of dies and the second semiconductor substrate is configured for being cut into a second group of dies;

encapsulating the framing member and the first and second semiconductor substrates within an encapsulant, thereby resulting in a multi-wafer encapsulated layer, wherein at least a portion of the encapsulant forms an encapsulant channel between the framing member and at least one of the first and second semiconductor substrates;

removing the carrier substrate from the multi-wafer encapsulated layer; and forming a redistribution layer (RDL) on the first and second semiconductor substrates of the multi-wafer encapsulated layer, thereby resulting in a multi-wafer panel.

16. The method of claim 15, wherein the carrier substrate has a coefficient of thermal expansion (CTE) that substantially matches a CTE of the first and second semiconductor substrates.

17. The method of claim 15, wherein the framing member has a coefficient of thermal expansion (CTE) that substantially matches a CTE of the first and second semiconductor substrates.

18. The method of claim 15, further comprising dicing the multi-wafer panel into separate dies that include the first and second groups of dies.

19. The method of claim 15, wherein each of the first and second semiconductor substrates comprises silicon.

20. The method of claim 19, wherein the framing member has a coefficient of thermal expansion (CTE) that substantially matches a CTE of silicon.

* * * * *